(12) United States Patent
Kim (10) Patent No.: US 9,887,390 B2
(45) Date of Patent: Feb. 6, 2018

(54) DISPLAY DEVICE COMPRISING GRAY COLOR FILTER

(71) Applicant: SAMSUNG DISPLAY CO., LTD., Yongin, Gyeonggi-Do (KR)

(72) Inventor: Woong Sik Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 4 days.

(21) Appl. No.: 14/714,082

(22) Filed: May 15, 2015

(65) Prior Publication Data

US 2016/0087247 A1 Mar. 24, 2016

(30) Foreign Application Priority Data

Sep. 23, 2014 (KR) .......................... 10-2014-0126956

(51) Int. Cl.
*H01L 51/52* (2006.01)
*H01L 27/32* (2006.01)

(52) U.S. Cl.
CPC ........ *H01L 51/5284* (2013.01); *H01L 27/322* (2013.01); *H01L 51/5209* (2013.01); *H01L 51/5268* (2013.01); *H01L 27/3213* (2013.01); *H01L 27/3258* (2013.01); *H01L 2251/55* (2013.01)

(58) Field of Classification Search
CPC ........................... H01L 27/3213; H01L 27/322
See application file for complete search history.

(56) References Cited

U.S. PATENT DOCUMENTS

| 2007/0200492 | A1* | 8/2007 | Cok | H01L 27/322 |
| | | | | 313/506 |
| 2009/0072730 | A1* | 3/2009 | Choi | H01L 27/3213 |
| | | | | 313/504 |
| 2010/0053034 | A1* | 3/2010 | Oyaizu | G02B 5/201 |
| | | | | 345/32 |
| 2011/0042697 | A1 | 2/2011 | Lee et al. | |
| 2011/0198629 | A1 | 8/2011 | Lee et al. | |
| 2012/0032583 | A1* | 2/2012 | Kim | H01L 27/322 |
| | | | | 313/504 |
| 2012/0319122 | A1* | 12/2012 | Ma | H01L 51/5284 |
| | | | | 257/72 |
| 2014/0326956 | A1 | 11/2014 | Wang et al. | |
| 2014/0346477 | A1* | 11/2014 | Chao | H01L 51/0024 |
| | | | | 257/40 |

FOREIGN PATENT DOCUMENTS

| KR | 10-2011-0018785 A | 2/2011 |
| KR | 10-2011-0093451 A | 8/2011 |
| KR | 10-2012-0012940 A | 2/2012 |
| KR | 10-2014-0131473 A | 11/2014 |

* cited by examiner

*Primary Examiner* — Michael Jung
*Assistant Examiner* — Mikka Liu
(74) *Attorney, Agent, or Firm* — Lewis Roca Rothgerber Christie LLP

(57) ABSTRACT

A display device may include a substrate, a color filter layer, on a first surface of the substrate, including a red color filter, a green color filter, a blue color filter, and a gray color filter, and an organic light emitting diode on the color filter layer. The gray color filter may have a blue light transmittance higher than red and green light transmittances.

14 Claims, 6 Drawing Sheets

DISPLAY DEVICE COMPRISING GRAY COLOR FILTER

CROSS-REFERENCE TO RELATED APPLICATION

This application claims priority to and the benefit of Korean Patent Application No. 10-2014-0126956, filed on Sep. 23, 2014 with the Korean Intellectual Property Office, the disclosure of which is incorporated herein in its entirety by reference.

BACKGROUND

1. Field

Aspects of embodiments of the present invention are directed toward a display device including a gray color filter.

2. Description of Related Art

An organic light emitting diode ("OLED") display is a self-emission display device which has an OLED that emits light to display an image. Unlike a liquid crystal display ("LCD"), the OLED display does not require a separate light source, and thus may have a relatively small thickness and light weight. Further, the OLED display is receiving attention as the next generation display by virtue of characteristics such as low power consumption, high brightness, and short response time.

Meanwhile, electrodes and wires in an OLED display may reflect ambient light. Due to the ambient light reflection, the OLED display may have difficulty in accurately displaying black color and may have a low contrast, thereby exhibiting poor display characteristics.

In order to suppress the reflection of ambient light, a polarizer and a phase retardation plate may be incorporated in an OLED. However, light generated from an organic light emitting layer is partially lost (or attenuated) while passing through the polarizer and the phase retardation plate.

It is to be understood that this background of the technology section is intended to provide useful background for understanding the here disclosed technology and as such, the technology background section may include ideas, concepts or recognitions that were not part of what was known or appreciated by those skilled in the pertinent art prior to the corresponding effective filing dates of subject matter disclosed herein.

SUMMARY

Aspects of embodiments of the present invention are directed toward an OLED display configured to effectively suppress ambient light reflection and also display white color having high color temperature.

According to an embodiment of the present invention, a display device includes a substrate, a color filter layer disposed on a first surface of the substrate and including a red color filter, a green color filter, a blue color filter, and a gray color filter, and an organic light emitting diode on the color filter layer. The gray color filter may have a blue light transmittance that is higher than its red light transmittance and its green light transmittance.

The gray color filter may include a black pigment and a blue pigment.

The black pigment may include carbon black.

The blue light transmittance of the gray color filter may be about 5% to about 50% higher than the red light transmittance of the gray color filter, and the blue light transmittance of the gray color filter may be about 5% to about 50% higher than the green light transmittance of the gray color filter.

The gray color filter may have a transmittance in a range of 50% to 95% with respect to light with a wavelength in a range of 420 nm to 500 nm and may have a transmittance in a range of 30% to 90% with respect to light with a wavelength in a range of 500 nm to 750 nm.

The gray color filter may have a light transmittance in a range of 50% to 90%.

The display device may further include a black matrix disposed on the substrate and configured to partition the red color filter, the green color filter, the blue color filter, and the gray color filter into pixels.

The black matrix may be between the substrate and the color filter layer.

The black matrix may be on a second surface of the substrate.

The display device may further include a light-scattering layer between the red, green, blue, and gray color filters and the organic light emitting diode.

The organic light emitting diode may include a first electrode on the color filter layer, an organic light emitting layer on the first electrode, and a second electrode on the organic light emitting layer.

The organic light emitting layer may emit white light.

A plurality of protrusions may be defined on a surface of the first electrode.

A polarizer may not be on the substrate.

According to aspects of embodiments of the present invention, a display device includes a gray color filter so as to effectively suppress ambient light reflection and also display white color having high color temperature.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present invention will be more clearly understood from the following detailed description taken in conjunction with the accompanying drawings, in which.

DETAILED DESCRIPTION

Hereinafter, embodiments of the present invention will be described in detail with reference to the accompanying drawings. However, the scope of the present invention is not limited to the following drawings and embodiments.

The terminology used herein is defined to appropriately describe the exemplary embodiments of the present invention, and thus may differ from terminology used in other contexts, depending on a user, the intent of an operator, or a custom. Accordingly, the terminology used herein must be defined based on the following overall description of this specification.

In the drawings, certain elements or shapes may be simplified or exaggerated to better illustrate embodiments of the present invention, and other elements present in some embodiments may also be omitted. Thus, the drawings are intended to facilitate the understanding of embodiments of the present invention. Like reference numerals refer to like elements throughout the specification.

It will be understood that when an element or layer is referred to as being "on," "connected to", or "coupled to" another element or layer, it can be directly on, connected, or coupled to the other element or layer, or one or more intervening elements or layers may also be present. As used herein, the terms "use," "using," and "used" may be considered synonymous with the terms "utilize," "utilizing," and "utilized," respectively. Further, the use of "may" when describing embodiments of the inventive concept refers to "one or more embodiments of the present invention". Also, the term "exemplary" is intended to refer to an example or illustration. Expressions such as "at least one of," when preceding a list of elements, modify the entire list of elements and do not modify the individual elements of the list.

Hereinafter, a first exemplary embodiment of the invention will be described with reference to FIGS. 1 and 2.

Figure 1:
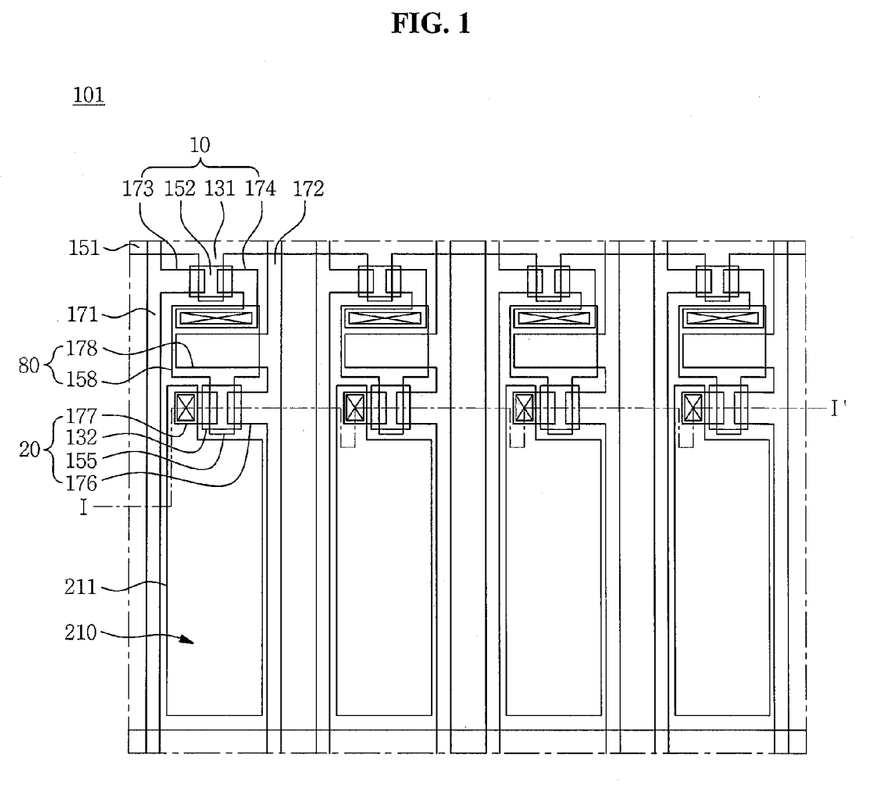
FIG. 1 is a plan view showing an organic light emitting diode display according to a first embodiment of the present invention.

FIG. 1 is a plan view showing an organic light emitting diode (OLED) display 101 according to the first exemplary embodiment of the invention. FIG. 2 is a cross-sectional view taken along the line I-I' of FIG. 1.

Figure 2:
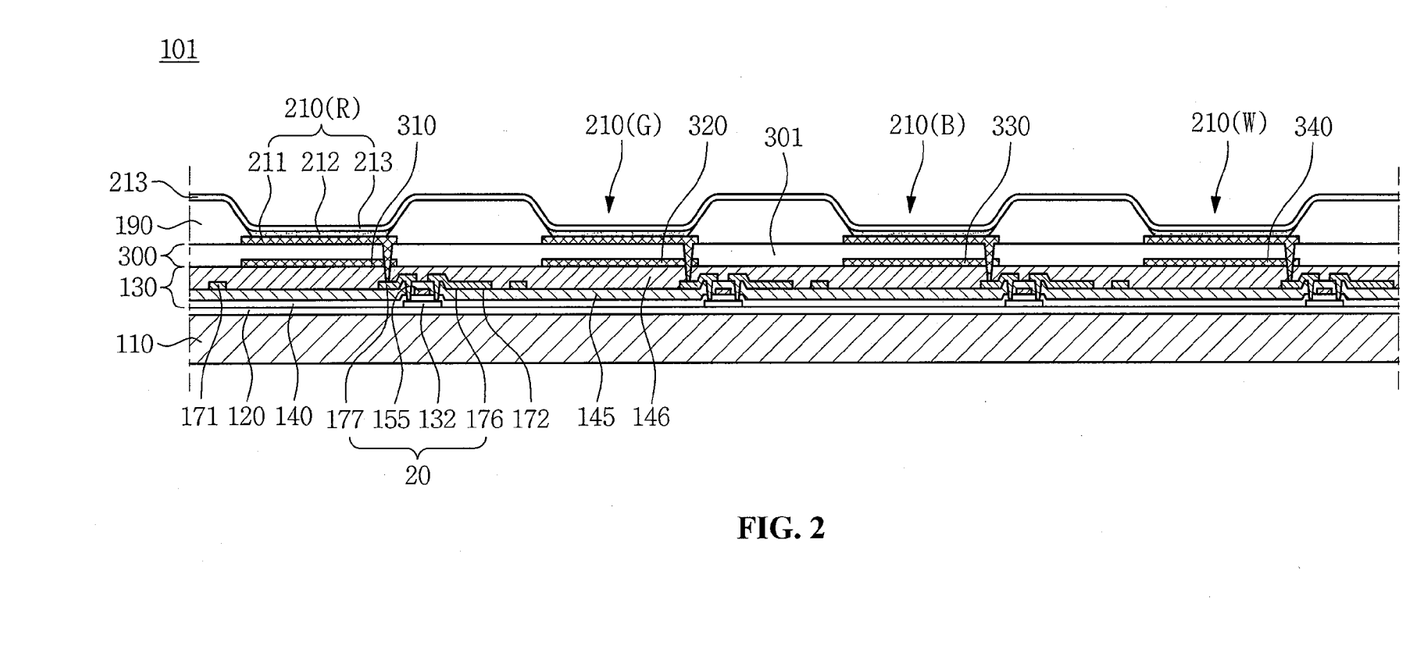
FIG. 2 is a cross-sectional view taken along the line I-I' of FIG. 1.

As illustrated in FIGS. 1 and 2, the OLED display 101 according to the first exemplary embodiment of the invention may include a substrate 110, an OLED 210, and color filters 310, 320, 330, and 340.

The substrate 110 may include an insulating material selected from the group consisting of glass, quartz, ceramic, plastic, and combinations thereof, or it may include another material or other materials. The substrate 110 may also include a metal material such as stainless steel.

A buffer layer 120 may be disposed on a first surface of the substrate 110. The buffer layer 120 may include one or more inorganic layers and/or one or more organic layers. The buffer layer 120 may planarize a surface (e.g., a surface of the substrate 110) while preventing undesirable elements (e.g., impurities or moisture) from infiltrating into a wire portion 130 of the OLED 210. However, the buffer layer 120 is not always present and may be omitted according to kinds of the substrate 110 and process conditions thereof.

The wire portion 130 may be disposed on the buffer layer 120. Further, the wire portion 130 may include a switching thin film transistor (TFT) 10, a driving TFT 20, and a capacitor 80 and may drive the OLED 210. The OLED 210 may display an image by emitting light according to a driving signal that is received from the wire portion 130.

FIGS. 1 and 2 illustrate an active matrix (AM) OLED display 101 with a 2Tr-1Cap structure having two TFTs 10 and 20 and one capacitor 80 in one pixel. However, the first exemplary embodiment of the invention is not limited thereto. For example, the OLED display 101 may have three or more TFTs and/or two or more capacitors in one pixel or may be configured to have various structures by further including separate wires. Herein, the pixel is the smallest unit that displays an element of an image, and the OLED display 101 displays an image utilizing a plurality of pixels.

The switching TFT 10, the driving TFT 20, the capacitor 80, and the OLED 210 may be disposed in each pixel. Further, a gate line 151 arranged along one direction and a data line 171 and a common power line 172 that are insulated from and cross the gate line 151 may also be disposed on the wire portion 130. A pixel may be defined by the gate line 151, the data line 171, and the common power line 172 as a boundary (e.g., the pixel may be formed as a crossing region of these lines), but it is not limited thereto. The pixel may also be defined by a pixel defining layer (PDL) or a black matrix 410.

The OLED 210 may include a first electrode 211, an organic light emitting layer 212 on the first electrode 211, and a second electrode 213 on the organic light emitting layer 212. Holes and electrons are respectively injected from the first electrode 211 and the second electrode 213 into the organic light emitting layer 212. The injected holes and electrons are coupled with each other to form excitons, and light is emitted when the excitons fall from an excited state to a ground state.

The capacitor 80 may include a pair of capacitor plates 158 and 178 with an interlayer insulating layer 145 interposed therebetween. Herein, the interlayer insulating layer 145 may include a dielectric material. Capacitance of the capacitor 80 may be determined by electric charge stored (e.g., energy charged) in the capacitor 80 and by voltage between the capacitor plates 158 and 178.

The switching TFT 10 may include a switching semiconductive layer 131, a switching gate electrode 152, a switching source electrode 173, and a switching drain electrode 174. The driving TFT 20 may include a driving semiconductive layer 132, a driving gate electrode 155, a driving source electrode 176, and a driving drain electrode 177. The semiconductive layers 131 and 132 may be respectively insulated from the gate electrodes 152 and 155 by a gate insulating layer 140.

The switching TFT 10 may act as a switching element configured to select a pixel to emit light. The switching gate electrode 152 may be coupled to the gate line 151. The switching source electrode 173 may be coupled to the data line 171. The switching drain electrode 174 may be spaced apart from the switching source electrode 173 and may be coupled to any one capacitor plate (e.g., the capacitor plate 158).

The driving TFT 20 may apply driving power to the first electrode 211, that is, a pixel electrode, for light emission of the organic light emitting layer 212 of the OLED 210 in a selected pixel. The driving gate electrode 155 may be coupled to the capacitor plate 158 that is coupled to the switching drain electrode 174. The driving source electrode 176 and the other capacitor plate 178 may each be coupled to the common power line 172. The driving drain electrode 177 may be coupled to the first electrode 211, which is a pixel electrode of the OLED 210, through a contact opening (e.g., a contact hole).

With the above-described structure, the switching TFT 10 may be driven by a gate voltage applied to the gate line 151 to transmit a data voltage applied to the data line 171 to the driving TFT 20. A voltage corresponding to the difference between a common voltage applied from the common power line 172 to the driving TFT 20 and the data voltage transmitted from the switching TFT 10 may be stored in the capacitor 80, and a current corresponding to the voltage stored in the capacitor 80 may flow to the OLED 210 through the driving TFT 20, so that the OLED 210 may emit light.

According to the first exemplary embodiment of the invention, the first electrode 211 may serve as an anode that injects holes and the second electrode 213 may serve as a cathode that injects electrons. However, the first exemplary embodiment of the invention is not limited thereto. For example, the first electrode 211 may be a cathode and the second electrode 213 may be an anode.

A protective layer 146 may be disposed on the interlayer insulating layer 145. The protective layer 146 may include an insulating material and may be configured to protect the wire portion 130. The protective layer 146 and the interlayer insulating layer 145 may include the same, or substantially the same, material, for example.

A color filter layer 300 may be disposed on the protective layer 146. The color filter layer 300 may include a red color filter 310, a green color filter 320, a blue color filter 330, and a gray color filter 340. The color filter layer 300 may further include a planarization layer 301 configured to protect the color filters 310, 320, 330, and 340 and planarize a surface on which the first electrode 211 is disposed. The planarization layer 301 may include the same, or substantially the same, material as the protective layer 146, for example. The color filters 310, 320, 330, and 340 may include features or characteristics further described below.

Meanwhile, the drain electrode 177 of the driving TFT 20 may be coupled to the first electrode 211 of the OLED 210 through a contact opening (e.g., contact hole) defined in the protective layer 146 and the planarization layer 301. The contact opening may penetrate a respective color filter 310, 320, 330, or 340.

According to the first exemplary embodiment of the invention, the first electrode 211 is a transmissive electrode and the second electrode 213 is a reflective electrode. Therefore, light generated in the organic light emitting layer 212 may be emitted by passing through the first electrode 211. In other words, the OLED display 101 according to the first exemplary embodiment of the invention may be a bottom emission device.

The first electrode 211, which, in one embodiment, is a transmissive electrode, may include a transparent conductive oxide (TCO). Examples of the TCO may include indium tin oxide (ITO), indium zinc oxide (IZO), zinc oxide (ZnO), aluminum zinc oxide (AZO) and/or indium oxide ($In_2O_3$), which are used alone or in a combination with each other. The TCO has a relatively high work function. Therefore, hole injection may be smoothly performed through the first electrode 211 including the TCO.

The second electrode 213, which, in one embodiment, is a reflective electrode, may include one or more metals, for example, magnesium (Mg), silver (Ag), gold (Au), calcium (Ca), lithium (Li), chromium (Cr), copper (Cu), aluminum (Al), and/or an alloy thereof.

At least one of a hole injection layer (HIL) and a hole transport layer (HTL) may be disposed between the first electrode 211 and the organic light emitting layer 212, and at least one of an electron transport layer (ETL) and an electron injection layer (EIL) may be disposed between the organic light emitting layer 212 and the second electrode 213.

The organic light emitting layer 212, the hole injection layer (HIL), the hole transport layer (HTL), the electron transport layer (ETL), and the electron injection layer (EIL) may be collectively called an organic layer. The organic layer may include a low molecular weight organic material or a high molecular weight organic material.

The low molecular weight organic material may be applied to the hole injection layer (HIL), the hole transport layer (HTL), the organic light emitting layer, the electron transport layer (ETL), and the electron injection layer (EIL). The low molecular weight organic material may be laminated in a single or complex (composite) structure. Examples of the organic material may include copper phthalocyanine (CuPc), N,N'-Di(naphthalene-1-yl)-N,N'-diphenyl-benzidine (NPB), and tris(8-hydroxyquinoline)aluminum (Alq3). The high molecular weight organic material may be applied to the hole injection layer and the organic light emitting layer 212.

An opening may be defined in a pixel defining layer 190. The opening of the pixel defining layer 190 may expose a portion of the first electrode 211. The first electrode 211, the organic light emitting layer 212, and the second electrode 213 may be sequentially laminated in the opening of the pixel defining layer 190. The second electrode 213 may be further disposed on the pixel defining layer 190 as well as the organic light emitting layer 212. The OLED 210 may emit light in the organic light emitting layer 212 disposed in the opening of the pixel defining layer 190. As described above, the pixel defining layer 190 may define a light emission region.

In the first exemplary embodiment according to the invention, the organic light emitting layer 212 may emit white light. That is, in the OLED display 101 according to the first exemplary embodiment of the invention, the OLED 210 may be a white OLED (WOLED). Therefore, an OLED 210(R) of a red pixel on the red color filter 310, an OLED 210(G) of a green pixel on the green color filter 320, an OLED 210(B) of a blue pixel on the blue color filter 330, and an OLED 210(W) of a white pixel on the gray color filter 340 may all have the same, or substantially the same, structure.

Although not illustrated, a capping layer may be disposed on the second electrode 213. The capping layer may protect the OLED 210. In order to protect the OLED 210, there may further be a thin film encapsulation layer (not shown) on the capping layer. The thin film encapsulation layer may have a structure in which one or more organic layers and one or more inorganic layers are alternately disposed thereon, and thus may reduce or effectively prevent infiltration of outside air such as moisture or oxygen into the OLED 210.

Hereinafter, the color filter layer 300 will be described in more detail.

The color filter layer 300 may include the red color filter 310, the green color filter 320, the blue color filter 330, and the gray color filter 340. The color filters 310, 320, 330, and 340 may be disposed corresponding to a light emitting area of a pixel. In other words, the color filters 310, 320, 330, and 340 may overlap the first electrode 211 of a plurality of OLEDs 210(R), 210(G), 210(B), and 210(W) and may be disposed under the first electrode 211.

The red color filter 310 may have a red-based color, the green color filter 320 may have a green-based color, and the blue color filter 330 may have a blue-based color. The gray color filter 340 may have a gray tone.

The color filters 310, 320, 330, and 340 may absorb light except that of the colors of the color filters. Thus, the OLED display 101 according to the first exemplary embodiment of the invention may effectively suppress ambient light reflection utilizing the color filters 310, 320, 330, and 340. The color filters 310, 320, 330, and 340 may reduce the mixing of light emitted from the OLED 210 with ambient light so as to prevent color defects of the OLED display 101.

The color filters 310, 320, 330, and 340 may include binders and pigments. That is, the color filters 310, 320, 330, and 340 may be formed using compositions including the binders and pigments.

In the OLED display 101 according to the first exemplary embodiment of the invention, the binders used for the respective color filters may be the same, or substantially the same, and may be a known binder utilized to form a color filter.

The red color filter 310 may include a red pigment, the green color filter 320 may include a green pigment, and the blue color filter 330 may include a blue pigment. The red, green, and blue pigments may be known pigments generally utilized for forming a color filter. In an exemplary embodiment, a C.I. Pigment Red type pigment may be used as the red pigment, a C.I. Pigment Green type pigment may be used as the green pigment, and a phthalocyanine-based pigment or an indanthrone blue pigment may be used as the blue pigment.

The gray color filter 340 may include a black pigment and a blue pigment.

Examples of the black pigment may include carbon black, but are not limited thereto. Examples of the blue pigment may include phthalocyanine pigment or indanthrone blue pigment. The phthalocyanine may include, for example, copper phthalocyanine, metal-free phthalocyanine, zinc phthalocyanine, cobalt phthalocyanine, nickel phthalocyanine, and iron phthalocyanine.

A gray color filter-forming composition may include about 3 wt % to about 30 wt % of the black pigment and about 2 wt % to about 20 wt % of the blue pigment based on the total weight of the gray color filter-forming composition. The amounts of the black and blue pigments may be variable when necessary. In other embodiments, the amounts of blue and black pigments may fall outside of these ranges.

The color filters may be patterned by photolithography, for example. For example, a color filter photocurable composition manufactured by adding a pigment to a photocurable binder may be applied to the protective layer 146, and thereafter the color filter may be formed in a part corresponding to an emission area by selective exposure and developing performed with a photomask.

Where the gray color filter 340 including the black pigment and the blue pigment is utilized, the OLED display 101 may have improved white realizing properties and may effectively prevent low contrast caused by ambient light reflection.

An OLED display may display a desired color by combining red, green, and blue pixels without a white pixel. However, if an OLED display includes only red, green, and blue pixels, the red, green, and blue pixels may be all driven with a luminance greater than or equal to a predetermined level for white realization. In this case, the power consumption of the OLED display may be relatively high. The OLED display 101 according to the first exemplary embodiment of the invention may include the white pixel so as to reduce the power consumption corresponding to white realization.

Meanwhile, in the case of an OLED display configured to display a color utilizing the white OLED (WOLED) and the color filters, white realization may be achieved even though the white pixel may lack a color filter. Although FIGS. 1-6 illustrate only one each of a red pixel, a green pixel, a blue pixel, and a white pixel, embodiments of the present invention may include a plurality of each of these kinds of pixels.

However, where the color filters are not disposed in the white pixel, a step may occur between red, green, and blue pixel areas in which the color filters are disposed and a white pixel area in which the color filters are not disposed. Accordingly, surface planarization may not be easily performed by the planarization layer 301 and the planarization layer 301 may be required to have a large thickness to provide acceptable planarization. Further, large reflection of ambient light may occur in the white pixel where the color filters are not disposed in the white pixel.

Where a white color filter is disposed in the white pixel, the step between the pixel areas may be removed, but the ambient light reflection occurring in the white pixel area may not be prevented.

In consideration of the above problems, the OLED display 101 according to the first exemplary embodiment of the invention may include the gray color filter 340 in the white pixel. The gray color filter 340 may have a transmittance in a range of 50% to 90% so as to suppress the ambient light reflection in the white pixel. When the transmittance of the gray color filter 340 is lower than 50%, luminous efficacy may be reduced, and when the transmittance of the gray color filter 340 is higher than 90%, anti-reflection efficiency of ambient light may be reduced.

The OLED display 101 according to the first exemplary embodiment of the invention may not include a circular polarizer for anti-reflection of ambient light. Accordingly, a polarizer may not be disposed on a second surface of the substrate 110.

White light emitted in a display device may have a very high color temperature, e.g., a color temperature of about 9000K. Blue light is should have a high luminous efficacy in order to realize white light having a high color temperature. However, there is a limit to the luminous efficacy of blue light, and thus it is not easy to realize the white light with a high color temperature and also power consumption increases in order to realize the white light having a high color temperature.

In the OLED display 101 according to the first exemplary embodiment of the invention, the gray color filter 340 disposed in the white pixel may include a blue pigment and may reinforce blue light emission.

The gray color filter 340 may have a blue light transmittance higher than red and green light transmittances. For example, the blue light transmittance of the gray color filter 340 may be about 5% to about 50% higher than the red and green light transmittances.

Further, the gray color filter 340 may have a transmittance in a range of 50% to 95% with respect to light with a wavelength in a range of 420 nm to 500 nm and may have a transmittance in a range of 30% to 90% with respect to light with a wavelength in a range of 500 nm to 750 nm.

The white light having a high color temperature may be realized owing to the gray color filter 340, and light emission balance may be achieved among the red, green, and blue colors.

Hereinafter, a second exemplary embodiment of the invention will be provided with reference to FIG. 3. In order to avoid repetitions, the components of the first exemplary embodiment will not be described.

Figure 3:
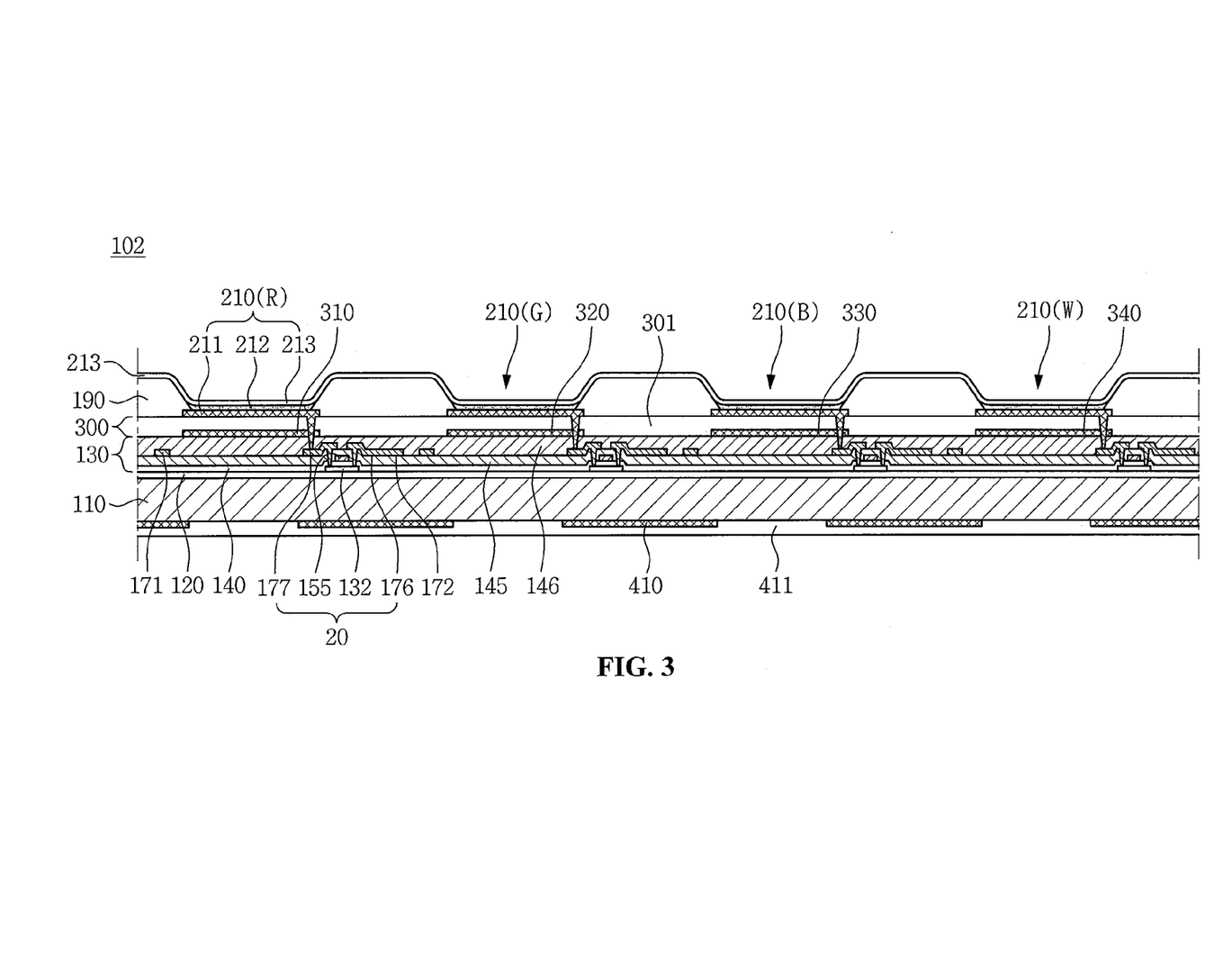
FIG. 3 is a cross-sectional view of an organic light emitting diode display according to a second embodiment of the present invention.

FIG. 3 is a cross-sectional view of an OLED display 102 according to the second exemplary embodiment of the invention.

The OLED display 102 according to the second exemplary embodiment of the invention may include the black matrix 410 on the first surface of the substrate 110 on which the wire portion 130 is disposed and on the second surface of the substrate 110, which is opposite the first surface. The black matrix 410 may be configured to partition the red color filter 310, the green color filter 320, the blue color filter 330, and the gray color filter 340 into pixels.

The black matrix 410 may be disposed corresponding to a non-emitting area of the substrate 110. The black matrix 410 may correspond to the pixel defining layer 190 in terms of position. An opening defined by the black matrix 410 may define an area where light generated in the organic light emitting layer 212 is emitted outwards by passing through one of the color filters 310, 320, 330, and 340. That is, the black matrix 410 may define light emitting areas.

The black matrix 410 may include, for example, a metal or metal compound. In an exemplary embodiment, the metal or metal compound may be deposited on the second surface of the substrate 110 and may then be etched (e.g., etched in a predetermined pattern) such that the black matrix 410 may be formed. Examples of the metal may include chromium (Cr) and the like, and examples of the metal compound may include chromium oxide (CrOx), chromium nitride (CrNx), and the like.

Further, the black matrix 410 may include an opaque photosensitive organic material. In an exemplary embodiment, the opaque photosensitive organic material may be applied to the second surface of the substrate 110 and may then be patterned by photolithography such that the black matrix 410 may be formed. The opaque photosensitive organic material may include carbon black, pigment mixtures, or dye mixtures.

The black matrix 410 may shield the OLED display 102 from unnecessary ambient light incident thereon. Accordingly, the OLED display 102 according to the second exemplary embodiment of the invention may effectively suppress ambient light reflection utilizing the black matrix 410, together with the color filters.

A passivation layer 411 may be disposed on the black matrix 410 so as to protect the black matrix 410. The passivation layer 411 may include the same, or substantially the same, material as the buffer layer 120.

Hereinafter, a third exemplary embodiment of the invention will be provided with reference to FIG. 4. The above-described components will not be repeatedly described for brevity.

Figure 4:
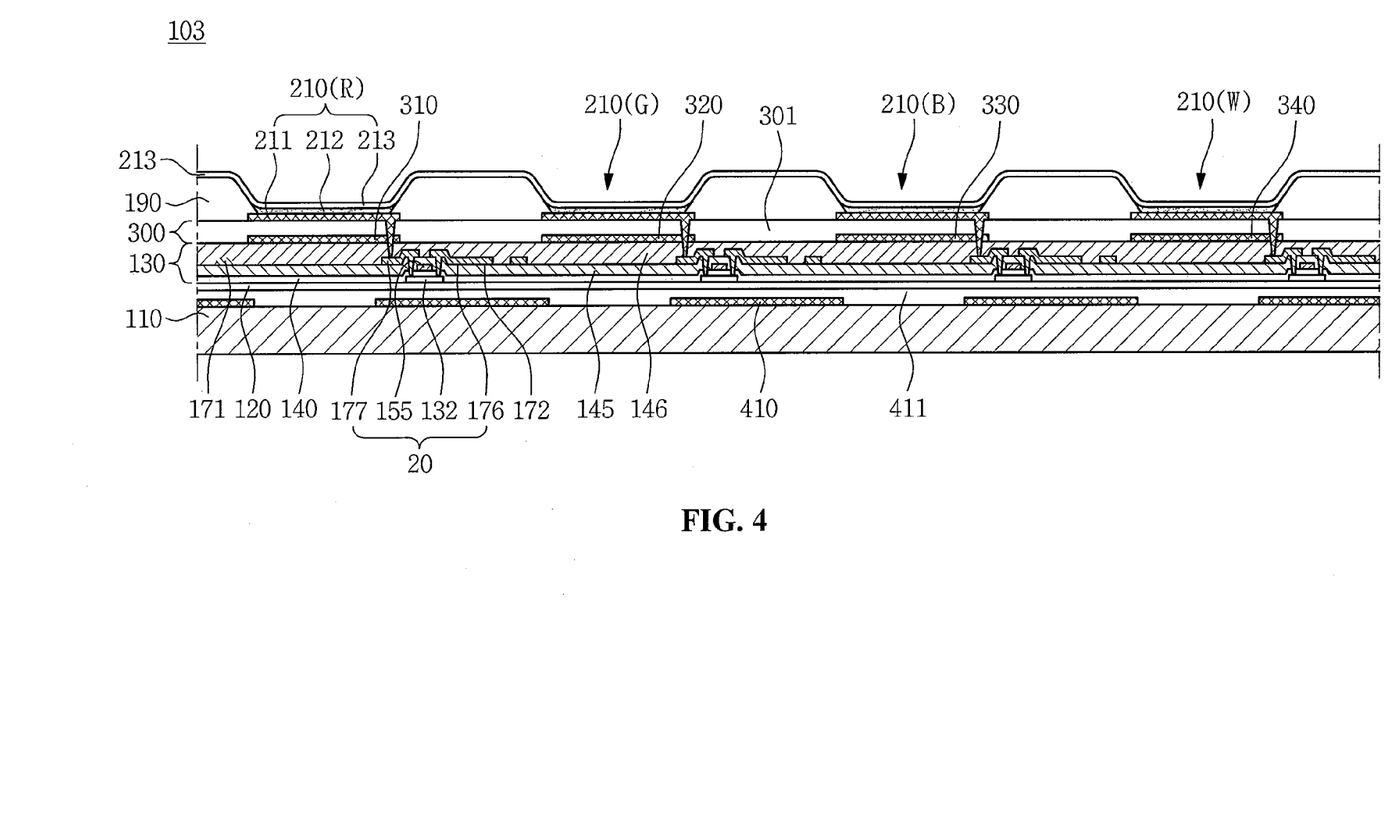
FIG. 4 is across-sectional view of an organic light emitting diode display according to a third embodiment of the present invention.

FIG. 4 is a cross-sectional view of an OLED display 103 according to the third exemplary embodiment of the invention.

The OLED display 103 according to the third exemplary embodiment of the invention may include the black matrix 410 between the substrate 110 and the color filter layer 300. For example, the black matrix 410 may be disposed between the substrate 110 and the wire portion 130.

In other words, the black matrix 410 may be disposed on the first surface of the substrate 110, the passivation layer 411 may be disposed on the black matrix 410, the buffer layer 120 may be disposed on the passivation layer 411, and the wire portion 130 may be disposed on the buffer layer 120. In this case, the passivation layer 411 may include the same, or substantially the same, material as the buffer layer 120 and any one of the passivation layer 411 and the buffer layer 120 may be omitted.

Where the black matrix 410 may include a material having high thermal resistance, it may not be damaged in a process of forming the wire portion 130, and thus the OLED display 103 according to the third exemplary embodiment may be manufactured without additional burden of processes.

Hereinafter, a fourth exemplary embodiment of the invention will be provided with reference to FIG. 5. The above-described components will not be repeatedly described for brevity.

Figure 5:
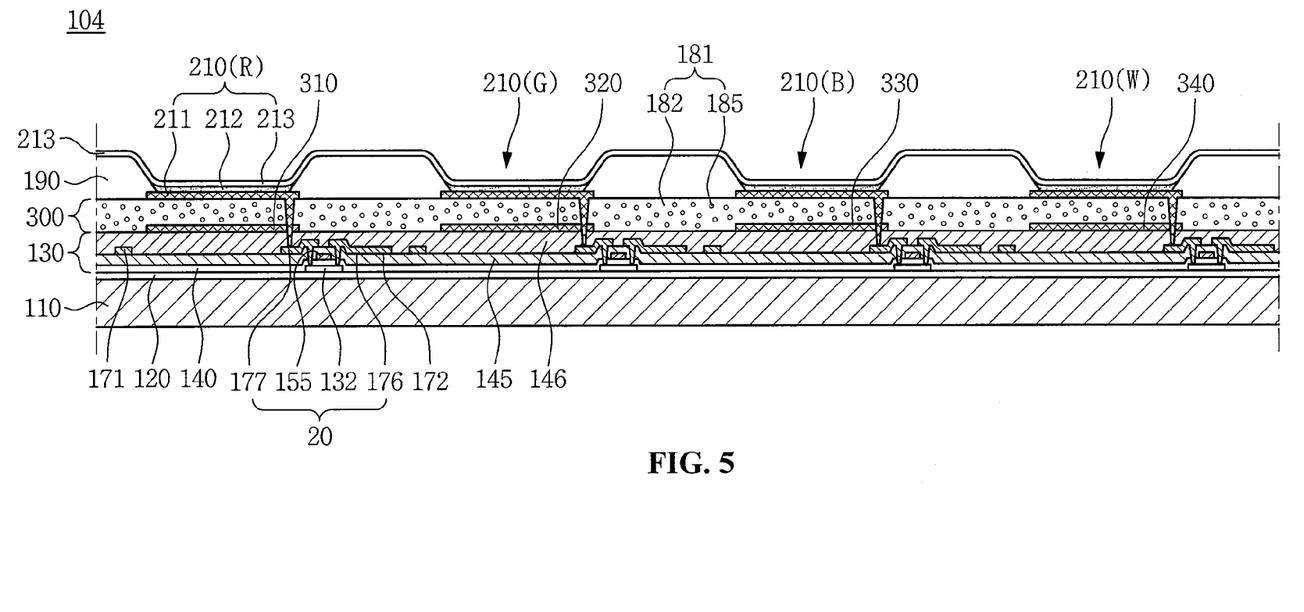
FIG. 5 is a cross-sectional view of an organic light emitting diode display according to a fourth embodiment of the present invention.

FIG. 5 is a cross-sectional view of an OLED display 104 according to the fourth exemplary embodiment of the invention.

The OLED display 104 according to the fourth exemplary embodiment of the invention may include a light-scattering layer 181 between the color filters 310, 320, 330, and 340 and the OLED 210.

For example, the light-scattering layer 181 may be disposed on the color filters 310, 320, 330, and 340, and the first electrode 211, organic light emitting layer 212, and second electrode 213 of the OLED 210 may be sequentially disposed on the light-scattering layer 181. The light-scattering layer 181 may act as a planarization layer that planarizes upper portions of the wire portion 130 and color filters 310, 320, 330, and 340. In this case, the color filter layer 300 may include the color filters 310, 320, 330, and 340 and the light-scattering layer 181.

The light-scattering layer 181 may include light-transmissive media 182 and light-scattering particles 185 dispersed in the light-transmissive media 182.

The light-transmissive media 182 may include a light-transmissive resin through which light is transmitted. Any material that transmits light may be used to form the light-transmissive media 182 without limitation. The light-transmissive media 182 may include one or more kinds selected from, for example, polyester-based resin, acrylic resin, cellulose-based resin, polyolefin-based resin, polyvinyl chloride resin, polycarbonate-based resin, phenolic resin, and urethane resin, which are characterized by light weight, low cost, and ease of handling. Among these, the light-transmissive media 182 may include polyester-based resin, polycarbonate-based resin, or acrylic resin, which has a good balance between strength and flexibility. However, the materials are not limited to those described above.

The light-scattering particles 185 may act to scatter and diffuse light. Any material that enables light diffusion may be used as the light-scattering particle 185 without limitation. The size and amount of the light-scattering particles 185 may be suitably selected when necessary. In an exemplary embodiment, the light-scattering particles 185 may have an average particle size in a range of 0.1 μm to 10 μm. However, the average particle size of the light-scattering particles 185 is not necessarily limited to the above range. The average particle size of the light-scattering particles 185 may vary depending on a use thereof.

The light-scattering particles 185 may be present in an amount of 5 to 50 parts by weight or in an amount of 20 to 40 parts by weight per 100 parts by weight of the light-transmissive media 182. When the amount of light-scattering particles 185 is less than 5 parts by weight per 100 parts by weight of the light-transmissive media 182, scattering of light may not be efficiently performed. When the amount of light-scattering particles 185 is greater than 50 parts by weight per 100 parts by weight of the light-transmissive media 182, light transmission or durability may be reduced.

The light-scattering particles 185 may include at least one material selected from, for example, acrylic resin, polystyrene (PS) resin, polyvinyl chloride resin, polycarbonate (PC) resin, polyethylene terephthalate (PET) resin, polyethylene (PE) resin, polypropylene (PP) resin, polyimide (PI) resin, glass, silica, $TiO_2$, $ZnO$, and $Al_2O_3$.

A refractive index of the light-scattering particles 185 may be higher or lower than a refractive index of the light-transmissive media 182. A path of light passing through the light-scattering particles 185 and, accordingly, the degree of light diffusion may vary depending on the difference in refractive indices between the light-scattering particles 185 and the light-transmissive media 182. The light-scattering particles 185 may scatter light emitted from the organic light emitting layer 212 so as to suppress total internal reflection and mix light radiated to many different paths. Therefore, the light-scattering particles 185 may improve light extraction efficiency of the OLED display 104 and may reduce white angular dependence (WAD) according to a viewing angle.

The light-scattering particles 185 shown in FIG. 5 may be dispersed all over the light-transmissive media 182, but embodiments of the invention are not limited thereto. The light-scattering particles 185 may be dispersed in a portion of the light-transmissive media 182, and for instance, the light-scattering particles 185 may be dispersed only in a region that overlaps the first electrode 211.

Hereinafter, a fifth exemplary embodiment of the invention will be provided with reference to FIG. 6. The above-described components will not be repeatedly described for brevity.

Figure 6:
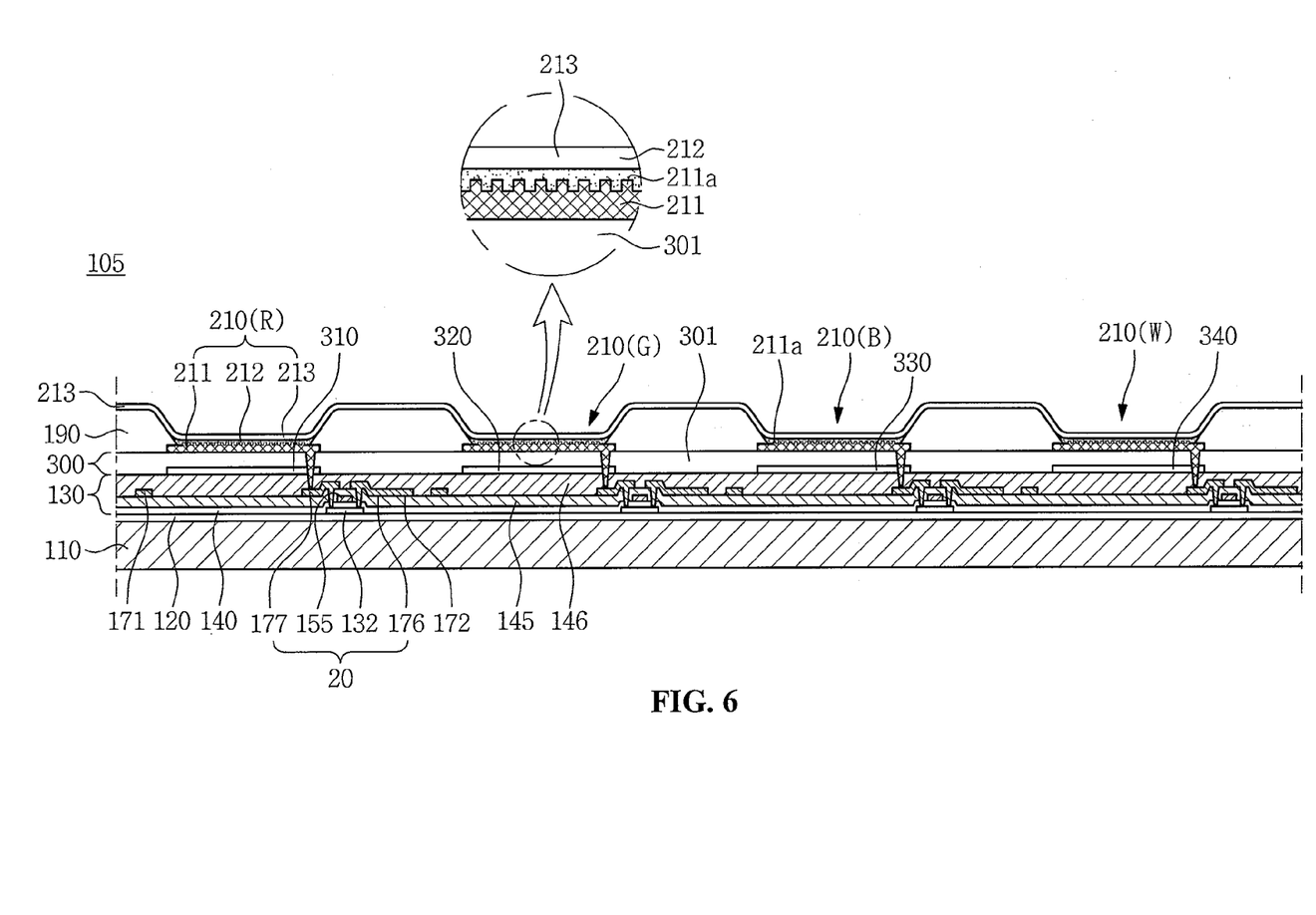
FIG. 6 is a cross-sectional view of an organic light emitting diode display according to a fifth embodiment of the present invention.

FIG. 6 is a cross-sectional view of an OLED display 105 according to the fifth exemplary embodiment of the invention.

The OLED display 105 according to the fifth exemplary embodiment of the invention may include the first electrode 211 having a surface on which a plurality of protrusions 211*a* is defined.

The plurality of protrusions 211*a* defined on the surface of the first electrode 211 may act to scatter light emitted from the organic light emitting layer 212. Therefore, the OLED display 105 may have improved light extraction efficiency and decreased white angular dependence (WAD) according to a viewing angle.

The plurality of protrusions 211*a* may be formed using a suitable known method such as photolithography or imprinting.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims and their equivalents.

What is claimed is:

1. A display device comprising:
a substrate;
a wire portion on a first surface of the substrate;
a color filter layer on the wire portion, the color filter layer comprising a red color filter, a green color filter, a blue color filter, and a gray color filter, the gray color filter comprising a black pigment and a blue pigment; and
an organic light emitting diode on the color filter layer, wherein the gray color filter has a blue light transmittance that is higher than its red light transmittance and its green light transmittance.

2. The display device of claim 1, wherein the black pigment comprises carbon black.

3. The display device of claim 1, wherein the blue light transmittance of the gray color filter is about 5% to about 50% higher than the red light transmittance of the gray color filter and the blue light transmittance of the gray color filter is about 5% to about 50% higher than the green light transmittance of the gray color filter.

4. The display device of claim 1, wherein the gray color filter has a transmittance in a range of 50% to 95% with respect to light with a wavelength in a range of 420 nm to 500 nm, and has a transmittance in a range of 30% to 90% with respect to light with a wavelength in a range of 500 nm to 750 nm.

5. The display device of claim 1, wherein the gray color filter has a light transmittance in a range of 50% to 90%.

6. The display device of claim 1, further comprising:
a black matrix on a second surface of the substrate, the black matrix being configured to partition the red color filter, the green color filter, the blue color filter, and the gray color filter into pixels.

7. The display device of claim 1, further comprising a black matrix on the substrate and between the substrate and the color filter layer, the black matrix being configured to partition the red color filter, the green color filter, the blue color filter, and the gray color filter into pixels.

8. The display device of claim 1, further comprising a light-scattering layer between the red, green, blue, and gray color filters and the organic light emitting diode.

9. The display device of claim 1, wherein the organic light emitting diode comprises:
a first electrode on the color filter layer;
an organic light emitting layer on the first electrode; and
a second electrode on the organic light emitting layer.

10. The display device of claim 9, wherein the organic light emitting layer emits white light.

11. The display device of claim 9, wherein a plurality of protrusions are defined on a surface of the first electrode.

12. The display device of claim 1, wherein a polarizer is not on the substrate.

13. The display device of claim 1, wherein the wire portion comprises a driving TFT electrically coupled to the organic light emitting diode.

14. The display device of claim 13, wherein a portion of the driving TFT extends through an opening in at least one of the red, green, blue, and gray color filters.

* * * * *